(12) United States Patent
Liu

(10) Patent No.: US 8,446,226 B2
(45) Date of Patent: May 21, 2013

(54) OVEN CONTROLLED CRYSTAL OSCILLATOR

(75) Inventor: Chaosheng Liu, Guangdong (CN)

(73) Assignee: Guangdong Dapu Telecom Technology Co. Ltd., Dongguan, Guangdong (CN)

( * ) Notice: Subject to any disclaimer, the term of this patent is extended or adjusted under 35 U.S.C. 154(b) by 92 days.

(21) Appl. No.: 13/144,425

(22) PCT Filed: Oct. 26, 2009

(86) PCT No.: PCT/CN2009/074613
§ 371 (c)(1),
(2), (4) Date: Jul. 13, 2011

(87) PCT Pub. No.: WO2011/026276
PCT Pub. Date: Mar. 10, 2011

(65) Prior Publication Data
US 2011/0273238 A1    Nov. 10, 2011

(30) Foreign Application Priority Data

Sep. 2, 2009  (CN) .......................... 2009 1 0042380

(51) Int. Cl.
*H03L 1/04*        (2006.01)
*H01L 41/053*    (2006.01)
*H03B 1/02*        (2006.01)
*H03B 5/32*        (2006.01)

(52) U.S. Cl.
USPC .................. 331/69; 331/66; 331/70; 331/158; 331/176; 310/315; 310/343; 310/344; 310/346; 310/348

(58) Field of Classification Search
USPC ......... 310/311, 315, 341, 343, 344, 346–349; 327/512–513; 331/65, 66, 68–70, 108 C, 331/108 D, 154, 158, 176
See application file for complete search history.

(56) References Cited

U.S. PATENT DOCUMENTS

| | | | | |
|---|---|---|---|---|
| 4,611,182 A * | 9/1986 | Chauvin et al. | ................ | 331/69 |
| 4,622,621 A * | 11/1986 | Barre | ............................ | 361/689 |
| 4,719,384 A * | 1/1988 | Hauden et al. | ................ | 310/343 |
| 6,621,361 B1 * | 9/2003 | Fry | .................................. | 331/69 |
| 7,253,694 B2 * | 8/2007 | Hardy et al. | .................. | 331/176 |
| 7,310,024 B2 * | 12/2007 | Milliren et al. | ................. | 331/69 |
| 7,782,147 B2 * | 8/2010 | Anderson et al. | ............... | 331/69 |
| 8,237,515 B2 * | 8/2012 | Keating | ....................... | 331/176 |

* cited by examiner

*Primary Examiner* — Levi Gannon
(74) *Attorney, Agent, or Firm* — Shimokaji & Associates P.C.

(57) ABSTRACT

An oven controlled crystal oscillator includes a thermostatic bath, an inner circuit board, an outer circuit board, a heating element, and a temperature sensor. The inner circuit board comprising a crystal oscillation circuit is positioned inside the thermostatic bath and electrically connected with the outer circuit board via a pin. The outer circuit board has a temperature control circuit and a power supply circuit. The heating element and the temperature sensor electrically connect with the outer circuit board. A through slot is formed through the outer circuit board, and the thermostatic bath is inserted into the through slot. By inserting the thermostatic bath into the through slot of the outer circuit board, the height and the weight of the oven controlled crystal oscillator are reduced, the electric connection performance is enhanced, and thus the stability of the output frequency of the oven controlled crystal oscillator is improved.

4 Claims, 3 Drawing Sheets

OVEN CONTROLLED CRYSTAL OSCILLATOR

FIELD OF THE INVENTION

The present invention relates to a crystal oscillator and, more particularly, to an oven controlled crystal oscillator.

BACKGROUND OF THE INVENTION

Quartz crystal oscillator has been used for several decades and played an important role in the electronics industry for its high frequency stability. Especially under a high development of the information technology industry, this quartz crystal oscillator is full of vitality much more. The quartz crystal oscillators served as a standard frequency source or a pulse signal source provide a frequency reference in telecommunications, satellite communications, Mobile Phone System, Global Positioning System, navigation, remote control, aerospace, high-speed computer, precise measuring instrument and consumable electronic products, which can not be replaced by other oscillators. The quartz crystal oscillators generally include non-temperature compensated crystal oscillator, temperature compensated crystal oscillator, voltage-controlled crystal oscillator, oven controlled crystal oscillator, and digital/μp compensated crystal oscillator. Therein the oven controlled crystal oscillator has the highest frequency stability and the highest precision, and the performances of aging rate, temperature stability, long-term stability, and short-term stability are excellent, therefore the oven controlled crystal oscillator is widely used in electronic equipments such as Global Positioning System, communications, measurement, telemetry and remote, spectrum and network analyzer.

As the oscillation characteristic of the quartz crystal varies with the temperature, thus the output frequency of the quartz crystal oscillator is affected. The oven controlled crystal oscillator is such a crystal oscillator that aims at reducing the output frequency variation of the oscillator caused by the change of external temperature to the minimum, by utilizing a thermostatic bath to keep a constant temperature of the crystal oscillator or quartz crystal. In the prior art, for further reducing the impact resulted by the temperature variation and improving the frequency stability of the oven controlled quartz oscillator, the oven controlled crystal oscillator generally includes an outer circuit board and an inner circuit board having a crystal oscillation circuit. As the working performance of the crystal oscillation circuit is easy to be affected by the temperature, thus the inner circuit board is positioned in the thermostatic bath. The outer circuit board including a temperature control circuit and a power supply circuit is fixed beneath the thermostatic bath, and electrically connected with the inner circuit board. Although the thermostatic bath can ensure the frequency stability of the oven controlled crystal oscillator, the oven controlled crystal oscillator of the prior art has the following problems. Firstly, the thermostatic bath is located over the outer circuit board, thereby increasing the height of the oven controlled crystal oscillator, which goes against a compact design. Secondly, the inner circuit board applies a way that configures a pin extending from the bottom of the inner circuit board, so that the inner circuit board is electrically connected with the outer circuit board located at the lower portion of the thermostatic bath. With this structure, the performance of the electric connection between the inner circuit board and the outer circuit board may be affected due to the vibration occurred during the assembling process, or the thermostatic bath may disengage from the outer circuit board due to the vibration.

Thus, there is a need for an improved oven control crystal oscillator with a high stability and a thin structure to overcome the above drawbacks.

SUMMARY OF THE INVENTION

One aspect of the present invention is to provide an oven controlled crystal oscillator with a high stability and a thin structure.

To achieve above objective, the present invention provides an oven controlled crystal oscillator comprising a thermostatic bath, an inner circuit board, an outer circuit board, a heating element, and a temperature sensor; the inner circuit board being positioned inside the thermostatic bath and electrically connected with the outer circuit board via a pin, and the inner circuit board comprising a crystal oscillation circuit; the outer circuit board comprising a temperature control circuit and a power supply circuit electrically connecting with the temperature control circuit; the heating element and the temperature sensor electrically connecting with the outer circuit board; therein a through slot is formed through the outer circuit board, and the thermostatic bath is inserted into the through slot.

In comparison with the prior art, the outer circuit board of the present invention has a through slot formed thereon, and the thermostatic bath is inserted into the through slot of the outer circuit board. This structure can decrease the total height of the oven controlled crystal oscillator significantly, which accords with the compact trend of the electronic products and is propitious to the compact design of the client products. Moreover, since the through hole is formed, the layout structure of the outer circuit board is utilized reasonably and skillfully, which simplifies the circuit board and reduces total weight of the oven controlled crystal oscillator. In addition, the outer circuit board can limit the thermostatic bath, so as to fix the thermostatic bath on the outer circuit board firmly, thereby improving the electric connection performance of the outer circuit board and the inner circuit board and, in turn improving the stability of the oven controlled crystal oscillator.

Preferably, the pin drills through a side wall of the thermostatic bath and extends along a direction parallel to the outer circuit board. Since the pin extends along the direction parallel to the outer circuit board, thus the electric connection performance of the oven controlled crystal oscillator is improved, basing on the electric connection between the inner circuit board and the outer circuit board.

Preferably, the heating element is fixed on an outer surface of a side wall of the thermostatic bath, which adapts for heating the thermostatic bath and equalizing the temperature within the thermostatic bath.

Preferably, a recess is depressed inward and formed at a connection portion between the bottom and the side wall of the thermostatic bath, and the heating element is mounted in the recess. With such structure, the position of the heating element is much reasonable, and the spatial arrangement of the oven crystal oscillator is reasonable, moreover, the temperature gradient within the thermostatic bath is improved effectively.

Preferably, the temperature sensor is fixed on the outer surface of the side wall of the thermostatic bath, which adapts for detecting and feeding back the temperature of the thermostatic bath, thereby equalizing the temperature within the thermostatic bath and decreasing the impact extent of the external environment to the temperature within the thermostatic bath.

Preferably, the oven controlled crystal oscillator further comprises a copper pipe fixed on the outer surface of the side wall of the thermostatic bath, and the temperature sensor is positioned within the copper pipe.

This invention will become much clearer according to the following detailed description in conjunction with the accompanying drawings. These accompanying drawings are used for explaining the embodiments of the present invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
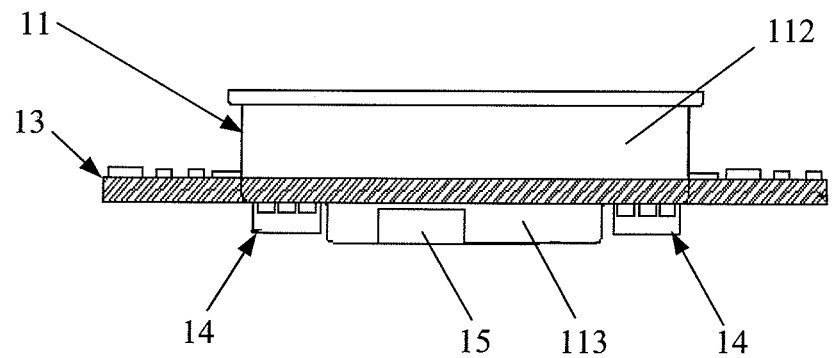
FIG. 1 is a structure view of the oven controlled crystal oscillator according to a first embodiment of the present invention.

Various preferred embodiments of the invention will now be described with reference to the figures, wherein like reference numerals designate similar parts throughout the various views. As indicated above, the invention is directed to an oven controlled crystal oscillator, which is thin and has a high stability.

Figure 2:
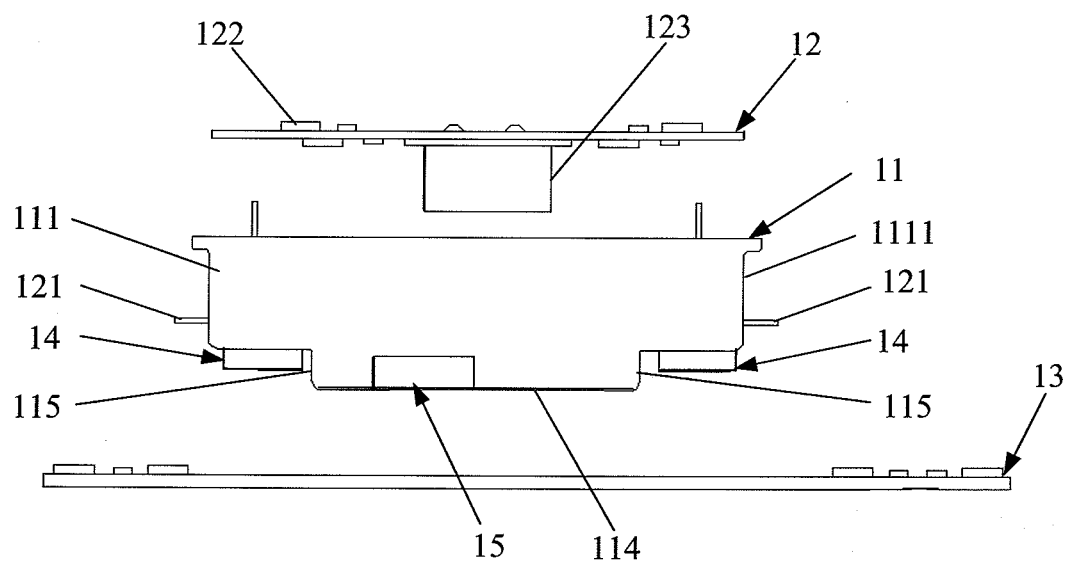
FIG. 2 is an exploded view of the oven controlled crystal oscillator shown in FIG. 1.
Figure 3:
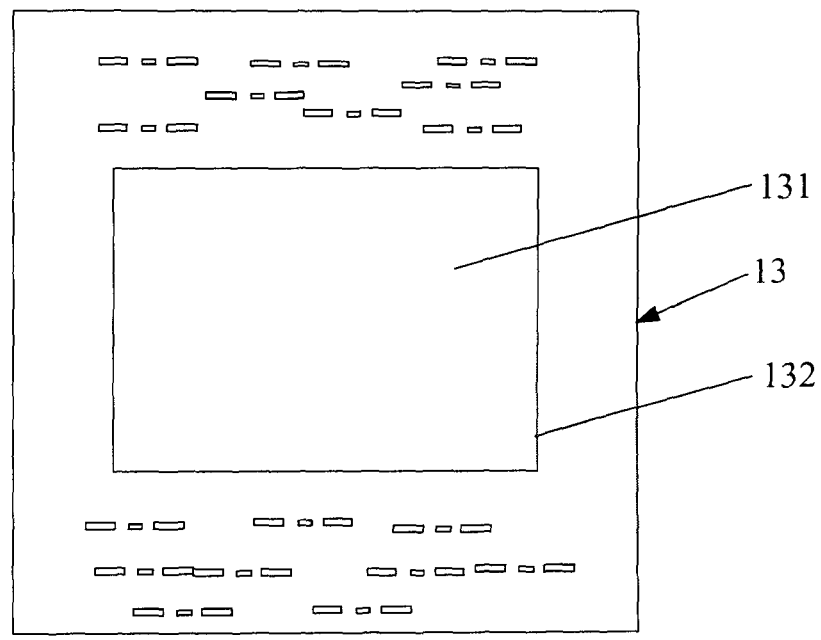
FIG. 3 is a structure view of the outer circuit board of the oven controlled crystal oscillator shown in FIG. 1.

FIG. 1 is a structure view of the oven controlled crystal oscillator according to a first embodiment of the present invention. Referring to FIGS. 1-3, the oven controlled crystal oscillator 1 includes a thermostatic bath 11, an inner circuit board 12, an outer circuit board 13, a heating element 14, and a temperature sensor 15. The inner circuit board 12 includes a crystal oscillation circuit that is composed of a quartz crystal 123 and an oscillation element 122, and the inner circuit board 12 is mounted within the thermostatic bath 11. The outer circuit board 13 includes a temperature control circuit (not shown) and a power supply circuit (not shown) connecting with the temperature control circuit. The heating element 14 and the temperature sensor 15 electrically connect with the outer circuit board 13.

Concretely, referring to FIGS. 1-3, a through slot 131 is formed on the outer circuit board 13 and runs through the outer circuit board 13, and the thermostatic bath 11 is inserted into the through slot 131. In this embodiment, the thermostatic bath 11 runs through the through slot 131 and connects with the outer circuit board 13 fixedly. More specifically, the outer surface 1111 of the side wall of the thermostatic bath 11 is bonded on the inner wall 132 of the side wall of the outer circuit board 13 by adhesives. The outer circuit board 13 is fixedly connected on the middle of the thermostatic bath 11, thereby dividing the thermostatic bath 11 into two portions including an upper portion 112 locating over the outer circuit board 13, and a lower portion 113 locating beneath the outer circuit board 13. Furthermore, the oven controlled crystal oscillator 1 further includes pins 121 which are conductors. One end of the pin 121 is connected with the inner circuit board 12 and fixed at a side of the inner circuit board 12, the other end of the pin 121 drills through the side wall 111 of the thermostatic bath 11, and extends to the outer circuit board 13 along a direction parallel to the outer circuit board 13. The outer circuit board 13 electrically connects with the inner circuit board 12 via the pins 121. With the design that the thermostatic bath 11 runs through the through slot 131 of the outer circuit board 13, the total height of the oven controlled crystal oscillator 1 is reduced, and the weight thereof is also reduced. Moreover, since the inner circuit board 12 electrically connects with the outer circuit board 13 by configuring pins at sides of the inner circuit board 12, thus the electric connection performance of the oven controlled crystal oscillator 1 is improved and, in turn, the stability of the output frequency of the oven controlled crystal oscillator 1 is improved.

Concretely, referring to FIGS. 1-2, a recess 115 is depressed inward and formed at a connection portion between the bottom surface 114 and the side wall 111 of the thermostatic bath 11, and the recess 115 locates at the lower portion 113 of the thermostatic bath 11. In this embodiment, the bottom surface 114 of the thermostatic bath 11 is quadrilateral. And the amount of the recess 115 is four; they locate at four corners of the lower portion 113 of the thermostatic bath 11 respectively. The heating element 14 is a heating pipe, and the amount of the heating element 14 also is four, and they are positioned within the four recesses 115 respectively. Specifically, the heating elements 14 are mounted within the recesses 115 by welding. The four heating elements 14 are electrically connected with the outer circuit board 13. The arrangement of the heating elements 14 can heat the thermostatic bath 11 more uniformly, improve the internal temperature gradient of the thermostatic bath 11 and, in turn improve the stability of the output frequency of the oven controlled crystal oscillator 1, and finally improve the working efficiency of the controlled crystal oscillator 1.

Concretely, as shown in FIG. 1, the temperature sensor 15 is fixedly on the outer surface 1111 of the side wall of the thermostatic bath 11. Concretely, the temperature sensor 15 is fixedly connected with the lower portion 113 of the thermostatic bath 11. The temperature sensor 15 electrically connected with the temperature control circuit of the outer circuit board 13 is adapted for detecting and feeding back the temperature of the thermostatic bath 11. Moreover, the temperature sensor 15 is connected with the temperature control circuit, thereby controlling the extent of heating for the heating element 14, equalizing the temperature of the thermostatic bath 11, and decreasing the impact of the external temperature to the thermostatic bath 11.

It should be noted that, the amount of the heating element of the oven control crystal oscillator is not limited to four, and the amount of the recess can be adjusted according to the amount of the heating element, depended on the actual demand.

Figure 4:
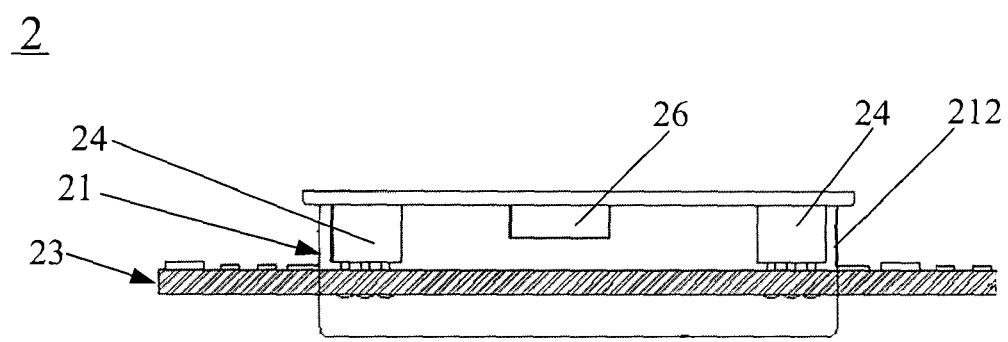
FIG. 4 is a structure view of the oven controlled crystal oscillator according to a second embodiment of the present invention.
Figure 5:
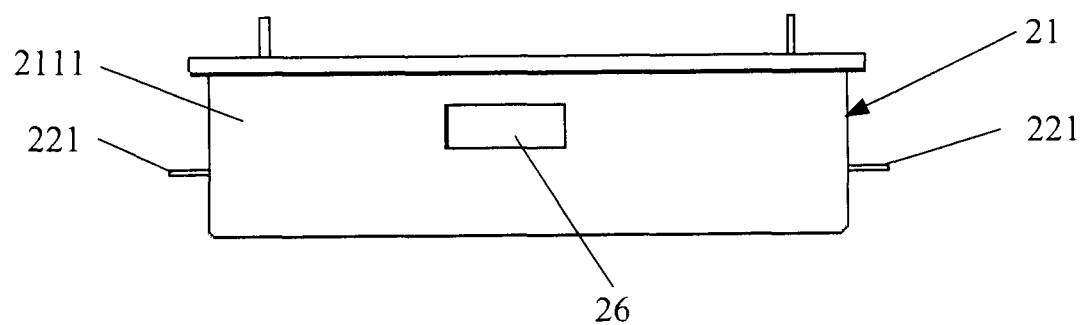
FIG. 5 is a structure view of the thermostatic bath of the oven controlled crystal oscillator shown in FIG. 4.

FIG. 4 is a structure view of the oven controlled crystal oscillator according to a second embodiment of the present invention. Referring to FIGS. 4-5, the oven controlled crystal oscillator 2 includes a thermostatic bath 21, an inner circuit board (not shown), an outer circuit board 23, a heating element 24, and a temperature sensor (not shown). The heating element 24 and the temperature sensor are electrically connected with the outer circuit board 23, and the inner circuit board is fixedly mounted within the thermostatic bath 21. The inner circuit board is electrically connected with the outer circuit board 23 via pins 221 drilling through the thermostatic bath 21. The difference compared with the first embodiment is that, there is no recess 115 formed on the oven controlled crystal oscillator 2; and the oven controlled crystal oscillator 2 further includes a copper pipe 26 and an outer surface 2111 of the side wall of the thermostatic bath 21 connected with the heating element 24. Concretely, the copper pipe 26 is fixed on the outer surface 2111 of the side wall of the thermostatic bath 21 by welding, and fixedly connected with the upper portion 212 of the thermostatic bath 21. The temperature sensor is positioned within the copper pipe 26. Concretely, the heating element 24 is fixed on the outer surface 2111 of the side wall of the thermostatic bath 21 by welding.

It should be noted that, the configuration of the temperature sensor of the oven controlled crystal oscillator is not limited to the above embodiments, and whether the copper pipe is needed or not is depended on the actual demand. In addition, the connection way between the thermostatic bath and the outer circuit board is not limited to the adhesive, it can apply welding or buckling and the like.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. An oven controlled crystal oscillator, comprising a thermostatic bath, an inner circuit board, an outer circuit board, a heating element, and a temperature sensor; the inner circuit board being positioned inside the thermostatic bath and electrically connected with the outer circuit board via a pin, and the inner circuit board comprising a crystal oscillation circuit; the outer circuit board comprising a temperature control circuit and a power supply circuit electrically connecting with the temperature control circuit; the heating element and the temperature sensor electrically connecting with the outer circuit board; wherein a through slot is formed through the outer circuit board, and the thermostatic bath is inserted into the through slot; wherein the heating element is fixed on an outer surface of a side wall of the thermostatic bath, a recess is depressed inward and formed at a connection portion between a bottom and the side wall of the thermostatic bath, and the heating element is mounted in the recess.

2. The oven controlled crystal oscillator according to claim 1, wherein the pin drills through a side wall of the thermostatic bath and extends along a direction parallel to the outer circuit board.

3. The oven controlled crystal oscillator according to claim 1, wherein the temperature sensor is fixed on an outer surface of a side wall of the thermostatic bath.

4. The oven controlled crystal oscillator according to claim 1, further comprising a copper pipe fixed on an outer surface of a side wall of the thermostatic bath, and the temperature sensor is positioned within the copper pipe.

* * * * *